United States Patent
Schweitzer, III et al.

(10) Patent No.: US 11,112,466 B2
(45) Date of Patent: Sep. 7, 2021

(54) EQUIPMENT FAILURE DETECTION IN AN ELECTRIC POWER SYSTEM

(71) Applicant: Schweitzer Engineering Laboratories, Inc., Pullman, WA (US)

(72) Inventors: Edmund O. Schweitzer, III, Pullman, WA (US); Tony J. Lee, Henderson, NV (US); David E. Whitehead, Pullman, WA (US); David J. Casebolt, Moscow, ID (US); Krishnanjan Gubba Ravikumar, Pullman, WA (US); Austin Edward Wade, Moscow, ID (US); Lisa Gayle Nelms, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/796,563

(22) Filed: Feb. 20, 2020

(65) Prior Publication Data

US 2021/0109164 A1   Apr. 15, 2021

Related U.S. Application Data

(60) Provisional application No. 62/914,494, filed on Oct. 13, 2019.

(51) Int. Cl.
*G01R 31/06* (2006.01)
*G01R 31/62* (2020.01)
(Continued)

(52) U.S. Cl.
CPC ......... *G01R 31/62* (2020.01); *G01R 31/3278* (2013.01); *H01F 27/402* (2013.01); *H02H 7/04* (2013.01)

(58) Field of Classification Search
CPC ..... G01R 31/024; G01R 31/086; H04L 63/14; H04L 29/02; H02H 1/007; H02H 1/0061; H02H 7/261
(Continued)

(56) References Cited

U.S. PATENT DOCUMENTS 6,396,279 B1   5/2002   Gruenert
6,608,493 B2   8/2003   Hensler
(Continued)

OTHER PUBLICATIONS

David Costello: Understanding and Analyzing Event Report Information, Oct. 2000.
(Continued)

*Primary Examiner* — Thang X Le
(74) *Attorney, Agent, or Firm* — Jared L. Cherry

(57) ABSTRACT

The present disclosure pertains to devices, systems, and methods for monitoring an electric power system. In one embodiment, a system may detect a failure in an electric power system. The system may include a communication interface to receive a first indication related to a condition in the electric power system, and a second indication related to the condition. The system may also include a test subsystem to compare the first indication to the second indication and to determine a discrepancy between the first indication and the second indication. A diagnostic subsystem may identify the failure based on the discrepancy between the first indication and the second indication. An alert subsystem may generate an alert based on the failure.

23 Claims, 5 Drawing Sheets

(51) Int. Cl.
*G01R 31/327* (2006.01)
*H01F 27/40* (2006.01)
*H02H 7/04* (2006.01)

(58) Field of Classification Search
USPC ........................................................ 324/547
See application file for complete search history.

(56) References Cited

U.S. PATENT DOCUMENTS

| | | | |
|---|---|---|---|
| 6,795,789 B2 | 9/2004 | Vandiver |
| 6,847,297 B2 | 1/2005 | Lavoie |
| 6,892,115 B2 | 5/2005 | Berkcan |
| 6,892,145 B2 | 5/2005 | Topka |
| 6,909,942 B2 | 6/2005 | Andarawis |
| 6,985,784 B2 | 1/2006 | Vandevanter |
| 6,999,291 B2 | 2/2006 | Andarawis |
| 7,012,421 B2 | 3/2006 | Lavoie |
| 7,043,340 B2 | 5/2006 | Papallo |
| 7,058,481 B2 | 6/2006 | Jiang |
| 7,058,482 B2 | 6/2006 | Fletcher |
| 7,068,483 B2 | 6/2006 | Papallo |
| 7,068,612 B2 | 6/2006 | Berkcan |
| 7,111,195 B2 | 9/2006 | Berkcan |
| 7,117,105 B2 | 10/2006 | Premerlani |
| 7,151,329 B2 | 12/2006 | Andarawis |
| 7,254,001 B2 | 8/2007 | Papallo |
| 7,259,565 B2 | 8/2007 | Diercks |
| 7,262,943 B2 | 8/2007 | Stellato |
| 7,301,738 B2 | 11/2007 | Pearlman |
| 7,460,590 B2 | 12/2008 | Lee |
| 7,532,955 B2 | 5/2009 | Dougherty |
| 7,636,616 B2 | 12/2009 | Fletcher |
| 7,693,607 B2 | 4/2010 | Kasztenny |
| 7,747,354 B2 | 6/2010 | Papallo |
| 7,747,356 B2 | 6/2010 | Andarawis |
| 7,986,503 B2 | 7/2011 | Papallo |
| 8,024,494 B2 | 10/2011 | Soed |
| 8,213,144 B2 | 7/2012 | Papallo |
| 8,560,255 B2 | 10/2013 | Elwarry |
| 8,891,963 B2 | 11/2014 | Patel |
| 9,366,711 B2 | 6/2016 | Klapper |
| 9,632,147 B2 | 4/2017 | Hensler |
| 9,813,173 B2 * | 11/2017 | Achanta | H04J 3/0638 |
| 9,819,611 B2 | 11/2017 | Snowdon |
| 10,178,047 B2 | 1/2019 | Chapman |
| 10,324,132 B2 * | 6/2019 | Saarinen | G01R 31/58 |
| 10,379,991 B2 | 8/2019 | Yang |
| 2003/0048508 A1 | 3/2003 | Yu |
| 2006/0193099 A1 * | 8/2006 | Schweitzer | H02H 1/0061 |
| | | | 361/115 |
| 2009/0012728 A1 | 1/2009 | Spanier |
| 2009/0296583 A1 | 12/2009 | Dolezilek |
| 2010/0040068 A1 | 2/2010 | Wimmer |
| 2010/0183298 A1 | 7/2010 | Biegert |
| 2014/0114608 A1 * | 4/2014 | Achanta | G01S 19/23 |
| | | | 702/176 |
| 2016/0013632 A1 | 1/2016 | Lloyd |
| 2017/0026291 A1 | 1/2017 | Smith |
| 2017/0117701 A1 * | 4/2017 | Johannesson | H02H 7/265 |
| 2017/0288950 A1 | 10/2017 | Manson |
| 2018/0034689 A1 | 2/2018 | Kanabar |
| 2018/0089057 A1 | 3/2018 | Yang |
| 2018/0275188 A1 * | 9/2018 | Dzienis | G01R 31/086 |
| 2018/0348267 A1 | 12/2018 | Yang |
| 2021/0028612 A1 * | 1/2021 | Kim | H02H 3/063 |

OTHER PUBLICATIONS

Joe Perez: A Guide to Digital Fault Recording Event Analysis, 2010.
Considerations for Use of Disturbance Recorders; a Report to the System Protection Subcommittee of the Power System Relaying Committee of the IEEE Power Engineering Society, Dec. 27, 2006.
David Costello: Event Analysis Tutorial, Part 1: Problem Statements 2011.
Jane Starck, Antti Hakala-Ranta, Martin Stefanka, Switchgear Optimization Using IEC 61850-9-2 and Non-Conventional Measurements May 23, 2012.
Will Allen, Tony Lee: Flexible High-Speed Load Shedding Using a Crosspoint Switch Oct. 2005.
Qiaoyin Yang, Rhett Smith: Improve Protection Communications Network Reliability Throught Software-Defined Process Bus, Jan. 2018.
Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

* cited by examiner

EQUIPMENT FAILURE DETECTION IN AN ELECTRIC POWER SYSTEM

RELATED APPLICATIONS

This application claims the benefit of priority under 35 U.S.C. § 119(e) to U.S. Provisional Patent Application No. 62/914,494, filed Oct. 13, 2019, and entitled "Equipment Failure Detection in an Electric Power System," the contents of which is hereby incorporated by reference in its entirety.

TECHNICAL FIELD

This disclosure relates to monitoring electric power systems. More particularly, this disclosure relates to utilizing sources of redundant or related information to improve reliability and protection of electric power systems by performing tests and diagnostic assessments of an electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
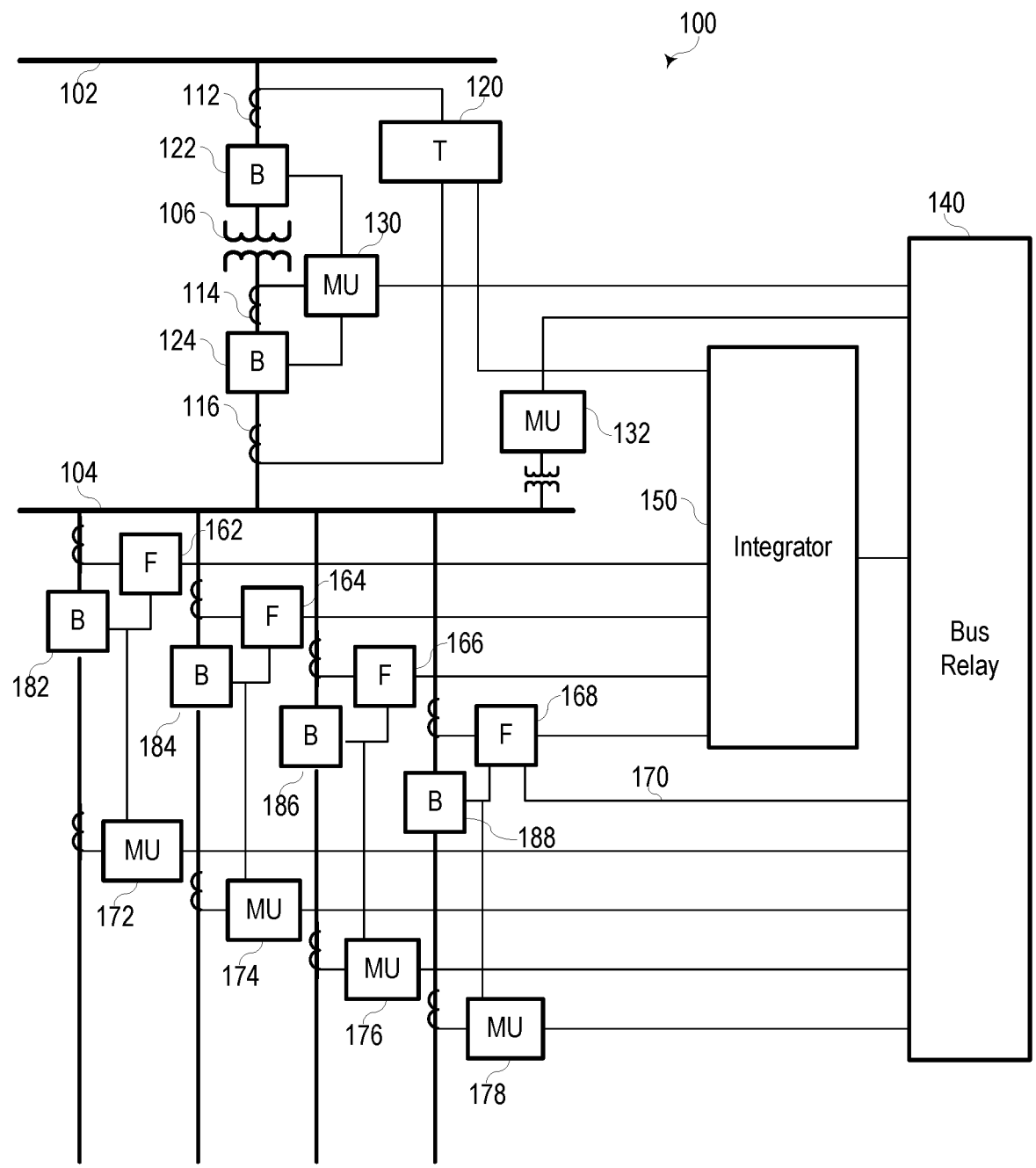
FIG. 1 illustrates a simplified one-line diagram of a portion of an electric power system configured to utilize redundant measurements of electrical conditions to test the operation of various components consistent with embodiments of the present disclosure.

Electric power systems are used to generate, transmit, and distribute electric power to loads, and serve as an important part of the critical infrastructure. In some cases, electric power systems and equipment may be monitored and protected by a variety of types of equipment. Such equipment may include sensors to monitor currents, voltages, phases, and other parameters of the electric power system. Relays may analyze the parameters of the electric power system to implement protective functions. The primary protective relays may communicate with various other supervisory devices such as automation systems, monitoring systems, supervisory (SCADA) systems and other intelligent electronic devices (IEDs).

Sensors to detect electrical parameters may be disposed throughout an electric power system, and in some cases, may provide redundant information. For example, multiple current sensors or voltage sensors may monitor electrical parameters with a bus. Such signals may be used by protective relays to provide protection functions to the bus or other portions of the electric power system; however, such information may not be shared with or used by other systems.

The inventors of the present application have recognized that redundant information may be used to enable self-testing of various components. For example, where two voltage sensors monitor a voltage and provide their respective signals to two protective devices, the redundant information may be used to continuously test the operation of each voltage sensor. If one sensor fails and the other continues to operate, a system that receives both measurements may detect the failure. Further, such a system may provide backup protection using information from the operating sensor.

In various embodiments, a supervisory device may receive signals reflecting electrical conditions in an electric power system, including redundant signals. A supervisory device may be referred to as an integrator. The integrator may receive information from a variety of devices and such information to implement a wide variety of functions, including the self-test functions described herein. Upon detection of an equipment failure, a notification may be provided to a user.

The systems and methods disclosed herein may be applied in a wide variety of specific circumstances. A few examples of such circumstances are identified below, but one of skill in the art will recognize that there are many other circumstances and scenarios in which the teachings of the present disclosure may be utilized. For example, if readings from redundant sources are more than 5% off from one another, an alarm may be generated to inform an operator of the inconsistent readings and to identify which devices of the electric power system may be responsible and/or affected. In another example, a system consistent with the present disclosure may determine whether a contact-sensing input is reporting a correct state. In this example, an integrator may receive a signal indicating a state of the contact (e.g., open or closed) and a signal monitoring a voltage at a point downstream from the contact. If the contact is actually open, the voltage sensor should not detect a voltage; however, if the contact sensor is faulty, it may indicate that the contact is open while the circuit is still energized. Accordingly, the integrator may utilize information from the contactor and the voltage sensor as independent sources of information and may use such information to verify the correct operation of each device.

In another example, a system consistent with the present disclosure may determine whether an output contact successfully operates an associated circuit. The system may receive an indication of the output contact and receive information about the action associated with the contact. If the signal provided by the output contact does not result in the expected action, an operator may be notified.

In another example, a system consistent with the present disclosure may monitor a direct current (DC) battery system used to provide power to a variety of devices in an electrical substation. Multiple relays may monitor the DC battery system and provide an indication if the system fails. Information from the relays may be compared to determine if a failure has occurred or if a system reporting a failure has malfunctioned.

In another example, a plurality of devices may be used to monitor watts or volts-amps-reactive (VAR) into and out of an electrical node. The current into or out of the node from each conductor impacts the sum, and as such, if the sum of the measurements are not zero, an operator may be notified.

These are just a few examples of monitoring, control, and protection that the systems and methods disclosed herein may provide. Various embodiments may provide monitoring and self-testing for communication failures, including monitoring and alarming for communication failures using various protocols (e.g., IEC 61850 GOOSE messaging over ethernet communications links) that do not natively provide for monitoring of critical protection signal paths. Still further, various embodiments may provide monitoring and self-testing for current transformer (CT) and/or potential transformer (PT) failures, analog-to-digital converter failures, protective relay failures, and time source/alignment failures. Monitoring of electric power systems using the systems and methods disclosed herein may facilitate compliance with regulatory obligations. For example, PRC-005-6 requires that operators of electric power systems may perform continuous or periodic testing of systems. Systems and methods consistent with the present disclosure may satisfy such standards by routinely testing systems using the techniques disclosed herein.

In various embodiments, the functionality disclosed herein may be added to existing systems without replacement of existing hardware, such as CTs, PTs, breakers, protective relays, and the like. Instead, data from existing hardware may be provided to a merging unit, which may receive data from existing hardware and prepare it for use by the integrator. A merging unit may receive and prepare information related to the operation of an electric power system (e.g., voltage signals, current signals, phase angle information, etc.) for use by an integrator consistent with the teachings of the present disclosure.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special purpose processing devices such as an application specific interface circuit (ASIC), PAL, PLA, PLD, field programmable gate array (FPGA), or any other customizable or programmable device.

FIG. 1 illustrates a simplified one-line diagram of a portion of an electric power system configured to utilize redundant measurements of electrical conditions to test the operation of various components consistent with embodiments of the present disclosure. Electric power system 100 includes equipment, such as a bus 102, which provides electric power to bus 104 via a transformer 106. Transformer 106 may step voltage from a high voltage to a lower voltage. Various feeders extend from bus 104 for delivering electric power to distributed loads. Circuit breakers 122, 124, 182, 184, 186, and 188 may be used to selectively connect and disconnect portions of the electric power system 100 for various purposes such as reconfiguration, protection in the event of a fault, or the like.

A bus relay 140 may be an IED configured to determine operating conditions on a zone that includes bus 104 and provide signals to implement a protection scheme. Bus relay 140 may obtain current signals related to electric power entering the bus 104 from merging unit ("MU") 130, and voltages from bus 104 using MU 132, and current signals related to electric power leaving bus 104 on the feeders from MUs 172, 174, 176, and 178. Bus relay 140 may be configured to provide differential protection, overvoltage protection, and various other protection for the zone including the bus 104. Bus relay 140 may provide information to integrator 150. Such information may include the voltage measured by MU 132, the feeder currents measured by MUs 172, 174, 176, and 178, and other electrical parameters.

A plurality of feeder relays 162, 164, 166, and 168 may obtain current signals related for a corresponding plurality of feeders and may provide overcurrent, directional, distance, overfrequency, underfrequency, and other protection to the feeders. Feeder relays 162, 164, 166, and 168 may provide information to integrator 150.

Transformer relay 120 may provide protection to transformer 106. Transformer relay 120 may obtain current signals from both sides of the transformer 106 from MUs or even directly from CTs 112 and 116. Transformer relay 120 may provide differential protection, overcurrent protection, over frequency protection, underfrequency protection, and other various protection for the transformer 106. Transformer relay 120 may further provide information to integrator 150, including current measurements gathered from CTs 112 and 116.

The relays in system 100 may be in communication with various circuit breakers 122, 124, 182, 184, 186, and 188 to provide signals to the circuit breakers and receive status information from the circuit breakers. Upon receiving an "open" signal, the circuit breakers 122, 124, 182, 184, 186, and 188 may open. For example, upon detection of an overcurrent condition on the first feeder, integrator 150 may signal feeder relay 162 to open breaker 182 to remove current from the faulted feeder. Alternatively, feeder relay 162 may actuate breaker 182 independent of integrator 150.

Integrator 150 may utilize redundant or related information gathered from equipment in system 100 to improve reliability and protection of electric power system 100 by performing tests and diagnostic assessments. For example, while breaker 124 is closed, the current flowing through CT 114 and CT 116 should be the same. Integrator 150 may receive the current measurements from each of CT 114 and CT 116 and compare the two measurements. A determination that the measurements are the same provides confirmation that each of CT 114 and CT 116 are operating; however, a deviation between these measurements may indicate that one of the CTs has failed. In one specific embodiment, where the current values from CT 112 and CT 116 are not equal or are not within a margin of error (e.g., 1%, 2%, 3%, 4%, 5%, 10% etc.) integrator 150 may generate an alert. Continuing the example, integrator 150 may also receive a current measurement from CT 112. The current on the high voltage side of transformer 106 is proportionate to the current on the low voltage side of transformer 106 and the ratio of turns in transformer 106. Accordingly, integrator 150 may also compare the current measurement made by CT 112 to the measurements made by CTs 114 and 116. If there is an inconsistency in measurements between CTs 114 and 116, the current measurement from CT 112 may further be used to determine which measurement is accurate.

A variety of other redundant and/or related measurements may also be used to evaluate the operation of other equipment. For example, the current flowing into bus 104, as measured by CT 116 and CT 114, should equal the current flowing out of bus 104, as measured by feeder relays 162, 164, 166, and 168. Where the current value measured by CT 114 and CT 116 is not equal or is not within a margin of error (e.g., 1%, 2%, 3%, 4%, 5%, 10%, etc.) of the sum of the currents measured by feeder relays 162, 164, 166, and 168, integrator 150 may generate an alert.

Integrator 150 may also use redundant and/or related measurements to determine whether a contact-sensing input is reporting a correct state. For example, the integrator 150 may receive a signal from the circuit breaker 124 indicating a state of the circuit breaker 124 (e.g., open or closed) and a signal from CT 116 monitoring a current at a point downstream from the circuit breaker 124. If the circuit breaker 124 is actually open, the CT 116 should not detect electrical current. Where current measured by the CT 116 does not correspond to the state of the circuit breaker 124, the integrator 150 may generate an alert.

Integrator 150 may also use redundant and/or related measurements to determine whether an output contact successfully operates an associated circuit. For example, the integrator 150 may receive a signal from the transformer relay 120 indicating an action on the circuit breaker 124 (e.g., an open or close action) and a signal from the circuit breaker 124 indicating a state of the circuit breaker 124 in response to the action on the circuit breaker 124. If the state signal provided by the circuit breaker 124 does not correspond to the expected state of the circuit breaker 124, the integrator 150 may generate an alert.

In various embodiments, integrator 150 may also provide backup protection in the event of a failure. For example, as discussed above, transformer relay 120 may utilize measurements from CTs 112 and 116 to provide protection to transformer 106. In the event that CT 116 fails, transformer relay 120 may be unable to perform protective functions; however, integrator 150 may provide backup protection using information from CT 114. In such a scenario, integrator 150 may analyze current measurements obtained from CT 114 and CT 112 to perform protection functions for transformer 106 until CT 116 is repaired. In another scenario, integrator 150 may send information from CT 114 to transformer relay 120, so that transformer relay 120 can continue to provide protection. Using information from CT 114, integrator 150 may generate an alarm for an operator, and integrator 150 may continue to route current measurements from CT 114 to transformer relay 120 until CT 116 is repaired.

Information provided to integrator 150 may also be analyzed by a condition-based monitoring (CBM) subsystem. A CBM subsystem may utilize information related to equipment in system 100 to perform predictive analysis and to monitor the health of equipment in system 100. The data collected by integrator 150 may be analyzed and used to establish trends, predict failures, and estimate the remaining life of equipment in system 100. The availability of redundant information may allow integrator 150 to identify and detect indications of wear or degradation of equipment in system 100 and to enable proactive maintenance to avoid failures.

Figure 2:
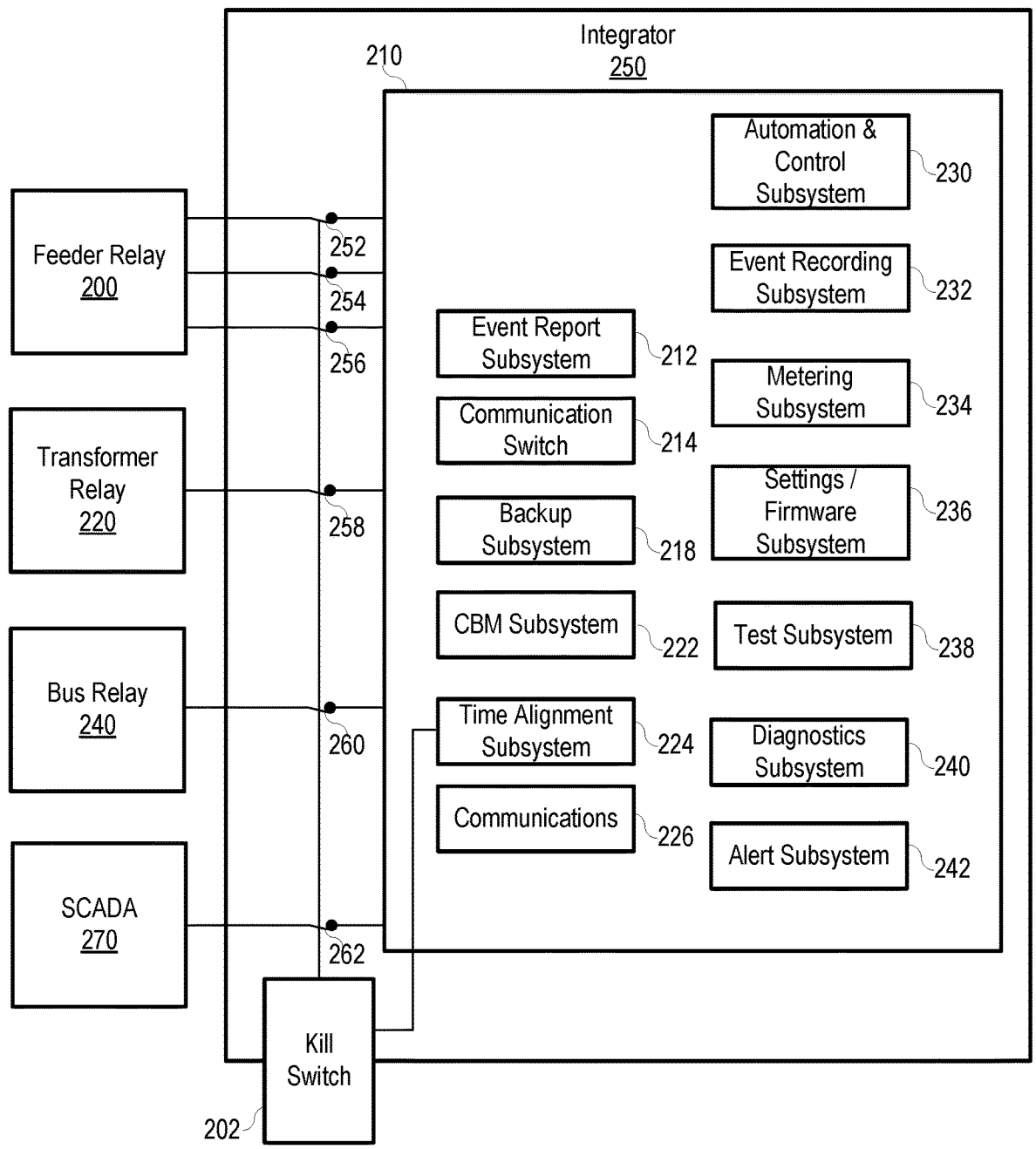
FIG. 2 illustrates a simplified block diagram of an integrator configured to detect equipment failure in an electric power system consistent with embodiments of the present disclosure.

FIG. 2 illustrates a simplified block diagram of an integrator 250 configured to detect equipment failure in an electric power system consistent with embodiments of the present disclosure. An integrator 250 may facilitate the physical separation of protection functions (performed by the primary protective relays) from non-protective functions (performed by the integrator 250). The function of the integrator 250 is to provide non-primary protective functions such as automation and backup protection for the power system, integration with other integrators, as well as communication with monitoring, automation, and supervisory systems. Additionally, the integrator 250 may utilize redundant or related information gathered to improve reliability and protection of electric power systems by performing tests and diagnostic assessments.

As illustrated in FIG. 2, the integrator 250 includes a processing device 210 for executing instructions related to such functions. The processing device 210 may be any processor capable of executing computer instructions including, for example, a computer processor, a microprocessor, an FPGA, or the like, and may be packaged with or be in communication with computer memory for storing computer instructions to be executed by the processing device 210. Various operations may be stored as computer instructions when executed by the processing device 210 and performed by the integrator 250.

Integrator 250 includes a plurality of subsystems to perform a variety of tasks. In the illustrated embodiment, integrator 250 includes a metering subsystem 234 to perform metering operations. The integrator 250 may also comprise a settings/firmware subsystem 236 to adjust settings and/or firmware management operations such as: maintaining current records of settings and firmware versions for each of the connected primary relays; updating settings on primary relays; updating firmware of primary relays; and the like. An event recording subsystem 232 may record data associated with an event (e.g., detection of an equipment failure). Event recording may include power system conditions, time, and actions taken. Information recorded by event recording subsystem 232 may be analyzed by event report subsystem 212 and used to generate a report. Such a report may include, among other things, conditions associated with the event, identification of the equipment impacted by the event, etc. A backup subsystem 218 may provide backup protection for various devices, such as electrical buses, feeders, transformers, and other types of primary protective relays. Additional functions that may be performed by the integrator 250 include automation and control 230. A communication switch 214 may route information among various components of integrator 250 as well as external devices in communication with integrator 250. A time alignment subsystem 224 may align measurements, messages, and other information using a common time source. Such time alignment may allow equipment to make use of information generated by other devices.

The integrator may also comprise a test subsystem 238 and a diagnostics subsystem 240. Test subsystem 238 may analyze readings from redundant sources to identify equipment malfunctions or failures. In one specific example, test subsystem 238 may receive a signal indicating a state of a contact (e.g., open or closed) and a signal monitoring a voltage at a point downstream from the contact. If the contact is actually open, a voltage downstream should not be detected; however, if the contact is faulty, it may indicate that the circuit is still energized. Accordingly, alert subsystem 242 may generate an alarm indicating that the contact is faulty.

A diagnostics subsystem 240 may identify the source of a deviation between redundant measurements. For example, an integrator 250 may monitor a bus and receive data values from all current transformers except one; however, a redundant measurement associated with the conductor shows current flowing through the conductor associated with the current transformer that is not detecting any current. In this example, the integrator may determine that the current transformer has failed. Information about the failed component may be included in an alert to facilitate repair of the faulty component.

A CBM subsystem 222 may receive information regarding the operation of equipment and to perform predictive analysis and to monitor the health of the equipment. The types of data analyzed may include, among other things, changes to measurements over time by redundant sources of information (e.g., for multiple CTs monitoring current through a conductor), actuation counts (e.g., for breakers or reclosers), and the like. Such information may be analyzed and used to establish trends, predict failures, and estimate the remaining life of equipment. CBM subsystem 222 may identify and detect indications of wear or degradation of equipment and to enable proactive maintenance and to avoid equipment failures.

The integrator 250 may be in communication with and facilitate communication among several different devices and systems including, for example: a feeder relay 200, a transformer relay 220, a bus relay 240, a motor relay, a generator relay, and the like. The integrator 250 may be in communication with other integrator(s), monitoring, automation, or supervisory systems such as, for example, SCADA 270. As suggested above, the integrator 250 may perform communication functions and may function as a communication switch among the various connected devices.

The integrator 250 may include one or more disconnect switches 252, 254, 256, 258, 260, and 262 for selectively making and breaking communication paths with the various connected devices. Any configuration of switches capable of selectively breaking the communication pathways to the various device may be used. The switches 252-262 may be in the form of electromagnetic relays capable of rapid disconnection. The switches 252-262 may be optical switches when communication with the devices uses optical media. The switches 252-262 may be configured to disconnect communication between the various devices and the integrator 250.

The switches 252-262 may be operated by a kill switch 202. When activated, the kill switch 202 may signal the switches to open (e.g. an electrical signal to a relay, an electrical signal to an optical switch, a physical action on physical contacts, or the like), thus disconnecting communications between the integrator 250 and the various devices, including the primary relays. The kill switch 202 may be operated by various actions. According to various embodiments, the kill switch 202 may be activated from a dedicated physical input (e.g., pushbutton, membrane button, switch, or the like), remotely by a contact input from an external device (e.g., a SCADA system or an intrusion system), an internal security function operating on the integrator 250, remotely using the communications operation 226, etc.

Figure 3:
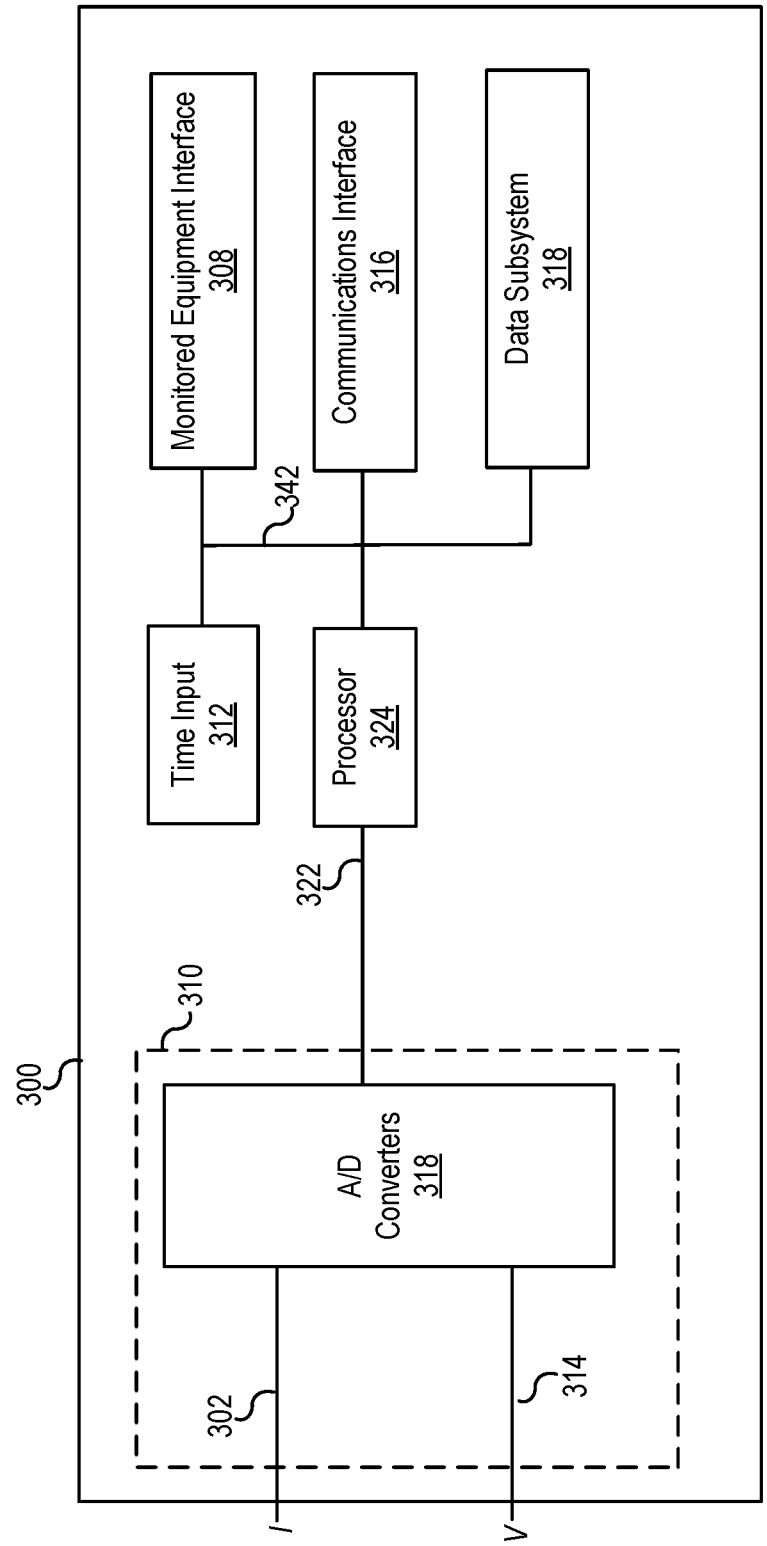
FIG. 3 illustrates a simplified block diagram of a merging unit consistent with embodiments of the present disclosure.

FIG. 3 illustrates a simplified block diagram of a merging unit (MU) 300 consistent with embodiments of the present disclosure. MU 300 may be implemented using hardware, software, firmware, and/or any combination thereof. In some embodiments, MU 300 may be embodied as an IED, while in other embodiments, certain components or functions described herein may be associated with other devices or performed by other devices. The specifically illustrated configuration is merely representative of one embodiment consistent with the present disclosure.

MU 300 includes a communications interface 316 to communicate with devices and/or IEDs. In certain embodiments, the communications interface 316 may facilitate direct communication with other IEDs or communicate with systems over a communications network. MU 300 may further include a time input 312, which may be used to receive a time signal (e.g., a common time reference) allowing MU 300 to apply a time-stamp to the acquired samples. In certain embodiments, a common time reference may be received via communications interface 316, and accordingly, a separate time input may not be required for time-stamping and/or synchronization operations. One such embodiment may employ the IEEE 1588 protocol. A monitored equipment interface 308 may receive status information from, and issue control instructions to, a piece of monitored equipment (such as a circuit breaker, conductor, transformer, or the like).

Processor 324 processes communications received via communications interface 316, time input 312, and/or monitored equipment interface 308. Time input 312, monitored equipment interface 308, communications interface 316, and data subsystem 318 may be connected to processor 324 by way of data bus 342. Processor 324 may operate using any number of processing rates and architectures. Processor 324 may perform various algorithms and calculations described herein. Processor 324 may be embodied as a general-purpose integrated circuit, an application-specific integrated circuit, a field-programmable gate array, and/or any other suitable programmable logic device.

In certain embodiments, MU 300 may include a sensor component 310. In the illustrated embodiment, sensor component 310 may receive high-fidelity current measurements 302 and/or high-fidelity voltage measurements 314. The sensor component 310 may comprise ND converters 318 that sample and/or digitize filtered waveforms to form corresponding digitized current and voltage signals provided to data bus 322. High-fidelity current measurements 302 and/or high-fidelity voltage measurements 314 may include separate signals from each phase of a three-phase electric power system. ND converters 318 may be connected to processor 324 by way of data bus 322, through which digitized representations of current and voltage signals may be transmitted to processor 324.

Data subsystem 318 may provide instructions to processor 324 to obtain electric current measurements from the processed communications received via communications interface 316 and/or sensor component 310 and analyze the electric power system measurements. In some instances, data subsystem 318 may provide instructions to processor 324 to analyze the electric power system measurements in response to receiving a request for an analysis of the electric power system measurements from an integrator.

Figure 4:
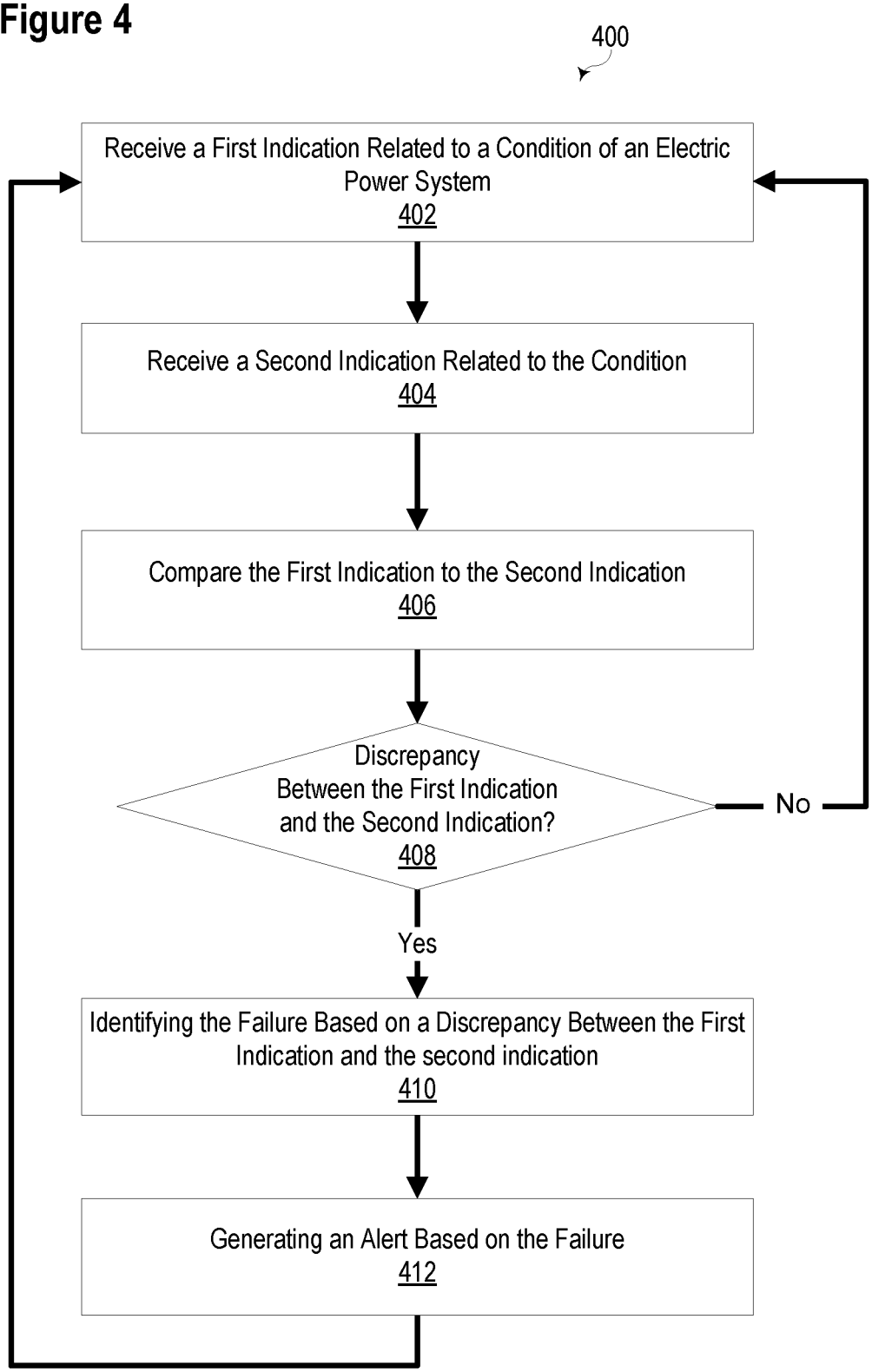
FIG. 4 illustrates a flow chart of a method for detecting an equipment failure in an electric power system consistent with embodiments of the present disclosure.

FIG. 4 illustrates a flow chart of a method 400 for detecting an equipment failure in an electric power system consistent with embodiments of the present disclosure. At 402, a first indication related to a condition in the electric power system is received. At 404, a second indication related to the condition is received. In various embodiments, the first indication and the second indication may comprise measurements of electrical parameters (e.g., voltage, current, etc.) obtained from redundant sources. In other embodiments, the first indication and the second indication may comprise measurements that are related but are not obtained from redundant sources (e.g., a breaker status indicator and a CT monitoring current flow downstream from the breaker). The first indication and the second indication are compared at 406.

At 408, method 400 may determine whether there is a discrepancy between the first indication and the second indication. A discrepancy may be determined using various criteria in different embodiments. For example, in one embodiment, a discrepancy may be determined if the first indication differs from the second indication by more than a threshold amount (e.g., 5%). In other examples, a discrepancy may be determined based on an inconsistency between the first indication and the second indication (e.g., a breaker reporting an open condition and a CT detecting current flow downstream from the breaker). If no discrepancy is identified at 408, method 400 may return to 402.

Upon detection of a discrepancy, a failure may be identified at 410. For example, a failure may be identified based on a difference between an electric current measured by a first current-sensing device and a second current-sensing device in a configuration where the first and second current-sensing devices should measure the same current. In another example, a failure may be identified when a measurement of electric current flowing into an electrical node does not equal a measurement of electric current flow out of the electrical node (i.e., when the sum on the current flowing into the electrical node and the current flowing out of the electrical node is not approximately zero). In certain embodiments, identifying a failure may further comprise identifying a component responsible for the failure. An alert may be generated at 412 based on the failure. If a component responsible for the failure is identified, the faulty component may be identified in the alert. The alert may be embodied in a variety of ways. In various embodiments, the alert may comprise an alarm, a visual indicator, an electric notification (e.g., an email, an SMS message, etc.), and the like.

Figure 5:
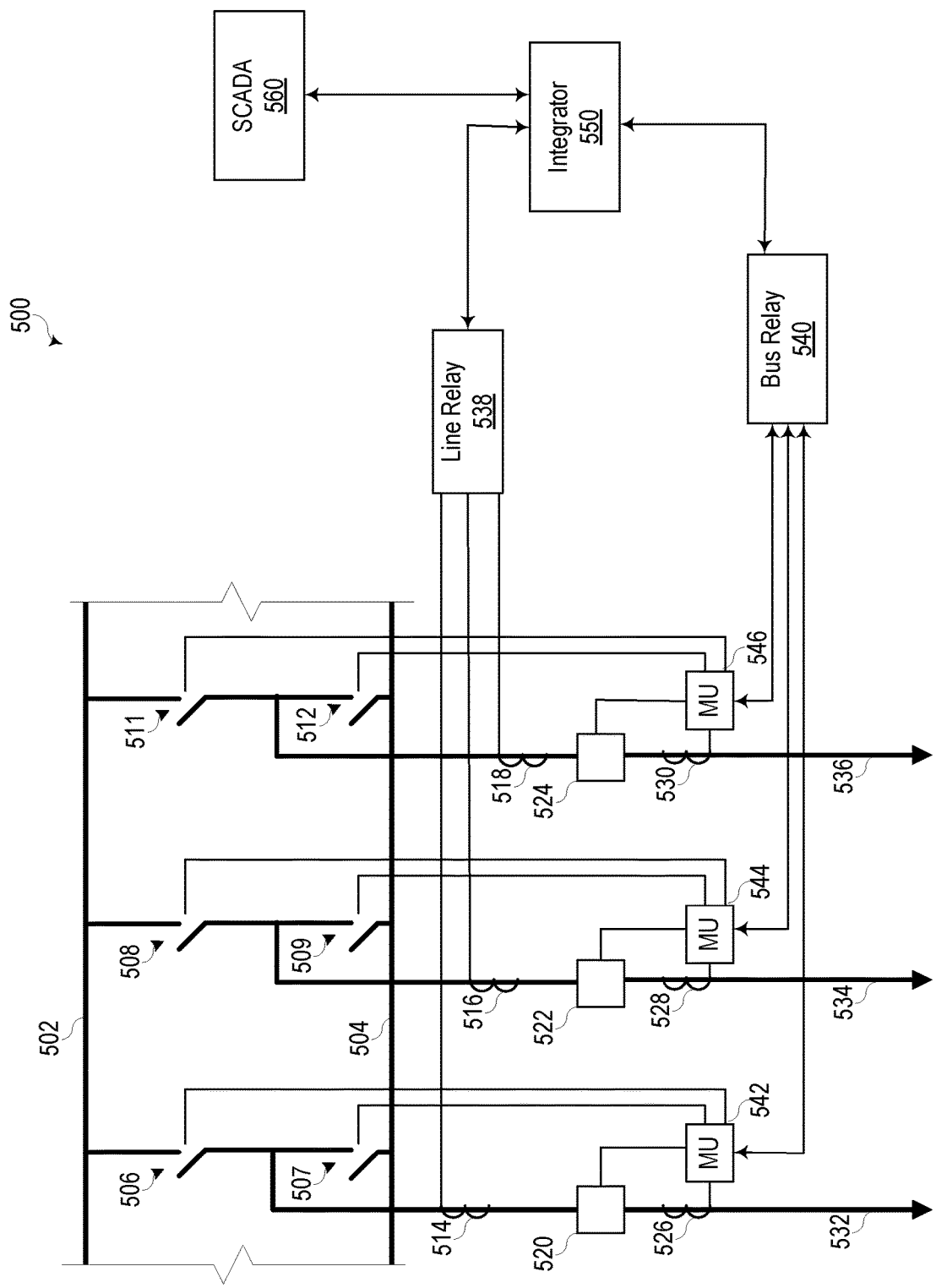
FIG. 5 illustrates a simplified one-line diagram of a portion of an electric power system configured to utilize redundant measurements to continue to implement a protection scheme despite a failure of a current transformer consistent with embodiments of the present disclosure.

FIG. 5 illustrates a simplified one-line diagram of a portion of an electric power system 500 configured to utilize redundant measurements to continue to implement a protection scheme following a failure of a current transformer consistent with embodiments of the present disclosure. Electric power system 500 includes a first bus 502 and a second bus 504, either of which may be connected to a plurality of lines 532, 534, or 536 based on the configuration of switches 506-512. Switches 506-512 may be controlled by MUs 542, 544, and 546. MUs 542, 544, and 546 may provide information to and/or receive instructions from bus relay 540.

Line relay 538 may monitor current flows through lines 532, 534, and 536 using information from CTs 514, 516, and 518, respectively, and selectively interrupt the flow of electrical current in the event of a fault or other situation (e.g., maintenance on a line). Line relay 538 may communicate measurements from CTs 514, 516, and 518 to integrator 550. Integrator 550 may also receive information from or transmit information to SCADA 560.

Bus relay 540 is in communication with MUs 542, 544, and 546, which receive current measurements from CTs 526, 528, and 530, respectively. MUs 542, 544, and 546 may generate digital representations of analog current measurements. Further, MUs 542, 544, and 546 are in communication with breakers 520, 522, and 524, and may actuate breakers 520, 522, and 524, respectively, based on control actions generated by bus relay 540. Bus relay 540 may communicate measurements from CTs 526, 528, and 530 to integrator 550. Further, bus relay 540 may communicate the status of breakers 520, 522, and 524 to integrator 550.

Certain protection algorithms implemented by bus relay 540 rely on measurements of currents flowing into and out of a bus. In the event of a failure of one or more CTs, a conventional bus relay may lack sufficient to implement protection algorithms, and accordingly, may take the bus out of service until the failed CT is repaired or replaced; however, in systems consistent with the present disclosure, integrator 550 may utilize redundant information and the illustrated architecture to implement a backup protection scheme. For example, CT 526 may fail, and thus bus relay 540 may not directly receive a measurement of current flowing through line 532. Rather than taking bus 504 out of service, integrator 550 may detect the failure, and may utilize the current measurements obtained by CT 514 until CT 526 is repaired or replaced. In this example, the protection functions typically implement by bus relay 540 may be performed by integrator 550, and any control actions (e.g., opening of breakers 520, 522, or 524) may be generated by integrator 550 and communicated via bus relay 540 to the appropriate MU 542, 544, or 546. In other embodiments, integrator 550 may forward current measurements obtained by MU 542 to bus relay 540, and bus relay 540 may continue to implement protection algorithms until CT 526 is repaired or replaced.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a failure in an electric power system, the system comprising:
   a communication interface to receive:
      a first indication related to a condition in the electric power system; and
      a second indication related to the condition;
   a test subsystem to:
      compare the first indication to the second indication;
      determine a discrepancy between the first indication and the second indication;
   a diagnostic subsystem to identify the failure based on the discrepancy between the first indication and the second indication; and
   an alert subsystem to generate an alert based on the failure;
   wherein:
      the first indication comprises an input to a protective relay;
      the second indication comprises an output from the protective relay; and
      the diagnostic subsystem identifies the failure based on a difference between the output from the protected relay and an expected output from the protective relay based on the input.

2. The system of claim 1, wherein the first indication is generated by a first primary protective relay and the second indication is generated by a second primary protective relay.

3. The system of claim 1, wherein:
   the first indication comprises a first measurement of an electric current generated by a first current-sensing device;
   the second indication comprises a second measurement of an electric current generated by a second current-sensing device; and
   the diagnostic subsystem identifies the failure based on a difference between the electric current measured by the first current-sensing device and the second current-sensing device.

4. The system of claim 1, wherein:
   the first indication comprises a first measurement of a voltage generated by a first voltage-sensing device;
   the second indication comprises a second measurement of a voltage generated by a second voltage-sensing device; and
   the diagnostic subsystem identifies the failure based on a difference between the voltage measured by the first voltage-sensing device and the second voltage-sensing device.

5. The system of claim 1, further comprising a backup subsystem to implement backup protection for the protective relay and to generate the expected output.

6. The system of claim 5, wherein the protective relay comprises a bus relay.

7. The system of claim 5, wherein the protective relay comprises a feeder relay.

8. The system of claim 5, wherein the protective relay comprises a transformer relay.

9. The system of claim 1, wherein:
   the diagnostic subsystem further identifies a component responsible for the failure; and
   the alert identifies the component.

10. The system of claim 1, wherein the discrepancy comprises a loss of a communication link.

11. A system to detect a failure in an electric power system, the system comprising:
    a communication interface to receive:
       a first indication related to a condition in the electric power system; and
       a second indication related to the condition;
    a test subsystem to:
       compare the first indication to the second indication;
       determine a discrepancy between the first indication and the second indication;
    a diagnostic subsystem to identify the failure based on the discrepancy between the first indication and the second indication; and
    an alert subsystem to generate an alert based on the failure;
    wherein:
       the first indication comprises a status of an output contact;
       the second indication comprises a measurement of a condition associated with the status of the output contact; and
       the diagnostic subsystem identifies the failure based on a difference between the status of the output contact and the condition associated with the status of the output contact.

12. A system to detect a failure in an electric power system, the system comprising:
    a communication interface to receive:
       a first indication related to a condition in the electric power system; and
       a second indication related to the condition;
    a test subsystem to:
       compare the first indication to the second indication;
       determine a discrepancy between the first indication and the second indication;
    a diagnostic subsystem to identify the failure based on the discrepancy between the first indication and the second indication;
    an alert subsystem to generate an alert based on the failure; and
    a condition-based monitoring subsystem to:
       receive information over time regarding operation of a piece of equipment in the electric power system;
       perform a predictive analysis based on the information; and
       generate an assessment of a remaining useful life of the piece of equipment.

13. A method for detecting a failure in an electric power system, the method comprising:
    receiving a first indication related to a condition in the electric power system;
    receiving a second indication related to the condition;
    comparing the first indication to the second indication;
    determining a discrepancy between the first indication and the second indication;

identifying the failure based on the discrepancy between the first indication and the second indication; and generating an alert based on the failure;

wherein:

the first indication comprises an input to a protective relay;

the second indication comprises an output from the protective relay; and identifying the failure based on a difference between the output from the protected relay and an expected output from the protective relay based on the input.

14. The method of claim 13, wherein the first indication is generated by a first primary protective relay and the second indication is generated by a second primary protective relay.

15. The method of claim 13, wherein:

the first indication comprises a first measurement generated by a first current-sensing device of an electric current;

the second indication comprises a second measurement generated by a second current-sensing device of the electric current; and identifying the failure comprises identifying a difference between the electric current measured by the first current-sensing device and the second current-sensing device.

16. The method of claim 13, wherein:

the first indication comprises a first measurement of an electric current flowing into an electrical node;

the second indication comprises a second measurement of an electric current flowing out of the electrical node; and identifying the failure comprises identifying that the electric current flowing into the electrical node does not equal the electric current flowing out of the electrical node.

17. The method of claim 13, wherein:

the first indication comprises a first measurement of a voltage generated by a first voltage-sensing device;

the second indication comprises a second measurement of a voltage generated by a second voltage-sensing device; and identifying the failure based on a difference between the voltage measured by the first voltage-sensing device and the second voltage-sensing device.

18. The method of claim 13, further comprising:

implementing backup protection for the protective relay; and generating the expected output.

19. The method of claim 13, wherein the protective relay comprises a bus relay.

20. The method of 14, wherein the protective relay comprises a feeder relay.

21. The method of 14, wherein the protective relay comprises a transformer relay.

22. The method of claim 13, wherein:

the first indication comprises a status of an output contact;

the second indication comprises a measurement of a condition associated with the status of the output contact; and the method identifies the failure based on a difference between the status of the output and the condition associated with the status of the output contact.

23. The method of claim 13, further comprising:

identifying a component responsible for the failure; and identifying the component in the alert.

* * * * *